(12) United States Patent
Kai et al.

(10) Patent No.: US 11,493,743 B2
(45) Date of Patent: Nov. 8, 2022

(54) OPTICAL UNIT FOR LASER PROCESSING SYSTEM AND LASER PROCESSING SYSTEM

(71) Applicant: Panasonic Intellectual Property Management Co., Ltd., Osaka (JP)

(72) Inventors: Takayuki Kai, Kyoto (JP); Kouki Ichihashi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 79 days.

(21) Appl. No.: 17/095,694

(22) Filed: Nov. 11, 2020

(65) Prior Publication Data

US 2021/0231933 A1  Jul. 29, 2021

(30) Foreign Application Priority Data

Jan. 28, 2020 (JP) .............................. JP2020-011712

(51) Int. Cl.
| | |
|---|---|
| *G02B 19/00* | (2006.01) |
| *G02B 27/09* | (2006.01) |
| *H01S 5/40* | (2006.01) |
| *H01S 5/022* | (2021.01) |

(52) U.S. Cl.
CPC ..... *G02B 19/0057* (2013.01); *G02B 19/0004* (2013.01); *G02B 27/0922* (2013.01); *G02B 27/0961* (2013.01); *H01S 5/022* (2013.01); *H01S 5/4025* (2013.01)

(58) Field of Classification Search
CPC ............ G02B 19/0057; G02B 19/0004; G02B 27/0922; G02B 27/0961; G02B 27/0955; G02B 19/0014; H01S 5/022; H01S 5/4025; H01S 5/0236; H01S 5/02253; H01S 5/02326; B23K 26/00; B23K 26/064; B23K 26/0648; B23K 26/70; B23K 26/702

See application file for complete search history.

(56) References Cited

U.S. PATENT DOCUMENTS

| 10,168,538 B2* | 1/2019 | Valois ................ G02B 27/0922 |
| 2003/0025196 A1* | 2/2003 | Nakamura .......... H01L 23/3735 |
| | | 257/E23.113 |
| 2005/0257912 A1* | 11/2005 | Monty .................... F28F 3/025 |
| | | 165/80.2 |

(Continued)

FOREIGN PATENT DOCUMENTS

| JP | 11-014876 | 1/1999 |
| JP | 2005-352062 | 12/2005 |

(Continued)

*Primary Examiner* — Robert E. Tallman
(74) *Attorney, Agent, or Firm* — Wenderoth, Lind & Ponack, L.L.P.

(57) ABSTRACT

An optical unit for a laser processing system includes a laser diode including a plurality of laser emitters which emit laser light, a lens unit including a plurality of lenses, a holding block having a light-transmitting property, and a light-shielding film. The holding block and the laser diode are bonded to each other with a first adhesive, and the lens unit and the holding block are bonded to each other with a second adhesive. The light-shielding film is located between the lens unit and the holding block.

8 Claims, 2 Drawing Sheets

(56) References Cited

U.S. PATENT DOCUMENTS

| | | | | |
|---|---|---|---|---|
| 2005/0287912 | A1* | 12/2005 | Yu | A63H 3/02 446/369 |
| 2017/0288365 | A1 | 10/2017 | Motofuji et al. | |
| 2018/0198257 | A1 | 7/2018 | Chann et al. | |

FOREIGN PATENT DOCUMENTS

| | | |
|---|---|---|
| JP | 2010-197412 | 9/2010 |
| JP | 2013-138086 | 7/2013 |
| WO | 2016/063436 | 4/2016 |

* cited by examiner

OPTICAL UNIT FOR LASER PROCESSING SYSTEM AND LASER PROCESSING SYSTEM

BACKGROUND

1. Technical Field

The present disclosure relates to an optical unit for a laser processing system and a laser processing system, and more particularly to an optical unit for a laser processing system and a laser processing system having a laser diode.

2. Description of the Related Art

High-power laser systems are used in applications such as welding, cutting, drilling, and material processes. In particular, in laser processing of metals having a relatively high reflectance with respect to long-wavelength laser light such as copper and aluminum, laser light having a wavelength equal to or less than 500 nm may be used. Further, in laser processing of a resin such as carbon fiber reinforced plastic, the laser light having the wavelength equal to or less than 500 nm which chemically reacts with the resin material may be used.

Such a laser system typically includes a laser emitter which emits laser light and an optical system which condenses the laser light onto a workpiece. For example, the laser light emitted from the laser emitter is coupled into an optical fiber, and the laser light from the optical fiber is processed by the optical system, so the laser light can be converged on the workpiece for processing.

A wavelength beam combine (hereinafter, also referred to as WBC) technology as in US-A-2018/0198257 is one section for obtaining beams with high-quality. A WBC system generally includes a laser emitter which outputs laser beams having different wavelengths, a diffraction grating which bends the laser beams at different angles for each wavelength, and a translucent mirror by which the laser beam externally resonates.

In a high-power laser system, a laser diode (LD) in which a plurality of laser emitters are arranged at a pitch of several hundred μm on one semiconductor chip is used so as to realize high power. In a case where such a laser diode is used, for each of the laser emitters arranged at a narrow pitch, a fast axis collimation (FAC) lens which adjusts a spread angle in a fast direction and changes a shape of a beam and a beam twister (BT) lens which adjusts the spread angle of the beam are required. The FAC lens and the beam twister lens are also arranged at the same pitch as the laser emitter. In a case where a lens unit in which these lenses are arranged at the narrow pitch is used, laser light emitted from the laser emitter enters the corresponding beam twister lens in the lens unit.

Japanese Patent Unexamined Publication No. 2010-197412 discloses an optical unit in which a lens is bonded to a holding member by an adhesive. As described above, the adhesive for bonding the members to each other may be provided on a surface of the lens unit. For example, in a laser processing system, an optical unit in which a lens unit and a laser diode are bonded by an adhesive is used. There is a case where laser light may reach the adhesive on the surface of the lens unit by applying the light emitted from a laser emitter to a location at which the laser light does not contribute to condensing. In particular, laser light having a short wavelength is likely to be scattered in various directions inside a glass due to Rayleigh scattering. When the adhesive is irradiated with the laser light having the short wavelength, there is a problem that adhesion and a deformation amount of the adhesive become large and deteriorate. When the adhesive deteriorates, an optical axis is displaced, and in the laser system, it can be difficult to form beams with high quality.

Further, according to Japanese Patent Unexamined Publication No. 2005-352062, although a light-shielding portion is provided between lenses in a lens unit, Rayleigh scattering of a glass in the lens unit cannot be suppressed, and in the same manner, laser light may hit an adhesive and deteriorate the adhesive.

SUMMARY

According to the present disclosure, there is provided an optical unit for a laser processing system including a laser diode that includes a plurality of laser emitters which emit laser light, a lens unit that includes a plurality of lenses, a holding block having a light-transmitting property, and a light-shielding film. The holding block and the laser diode are bonded to each other with a first adhesive. The lens unit and the holding block are bonded to each other with a second adhesive. The light-shielding film is located between the lens unit and the holding block.

DETAILED DESCRIPTIONS

In an optical unit used in a laser processing system, it is not easy to prevent laser light from reaching an adhesive and to prevent the adhesive from deteriorating.

An object of the present disclosure is to provide an optical unit for a laser processing system and a laser processing system in which an adhesive is less likely to deteriorate.

The optical unit for a laser processing system (hereinafter, also referred to as an optical unit) according to the present disclosure includes a laser diode that includes a plurality of laser emitters which emit laser light, a lens unit that includes a plurality of lenses, a holding block having a light-transmitting property, and a light-shielding film having a light-reflecting property or a light-absorbing property. The holding block and the laser diode are bonded with a first adhesive. The lens unit and the holding block are bonded with a second adhesive. The light-shielding film is located between the lens unit and the holding block.

In the optical unit for a laser processing system according to the present disclosure, since the light-shielding film is provided between the lens unit and the holding block, laser light from the laser diode is reflected multiple times inside the lens unit, so that the multiple-reflected laser light can be prevented from entering the holding block. In particular, laser light having a short wavelength such as blue has large Rayleigh scattering, so that the laser light is easily scattered inside the lens unit, and the laser light is easily reflected multiple times. Meanwhile, since the light-shielding film is provided between the lens unit and the holding block, it becomes difficult for the laser light to penetrate into the holding block, and it is possible to prevent the first adhesive provided on the holding block from being irradiated with the laser light and deteriorating the adhesive.

A laser processing system according to the present disclosure includes the optical unit for a laser processing system and a condensing section which condenses laser light.

With the optical unit for a laser processing system and the laser processing system according to the present disclosure, it is possible to prevent the adhesive from deteriorating.

Optical Unit

Hereinafter, the optical unit for a laser processing system according to the present disclosure will be described in detail based on exemplary embodiments.

Exemplary Embodiment 1

Figure 1:
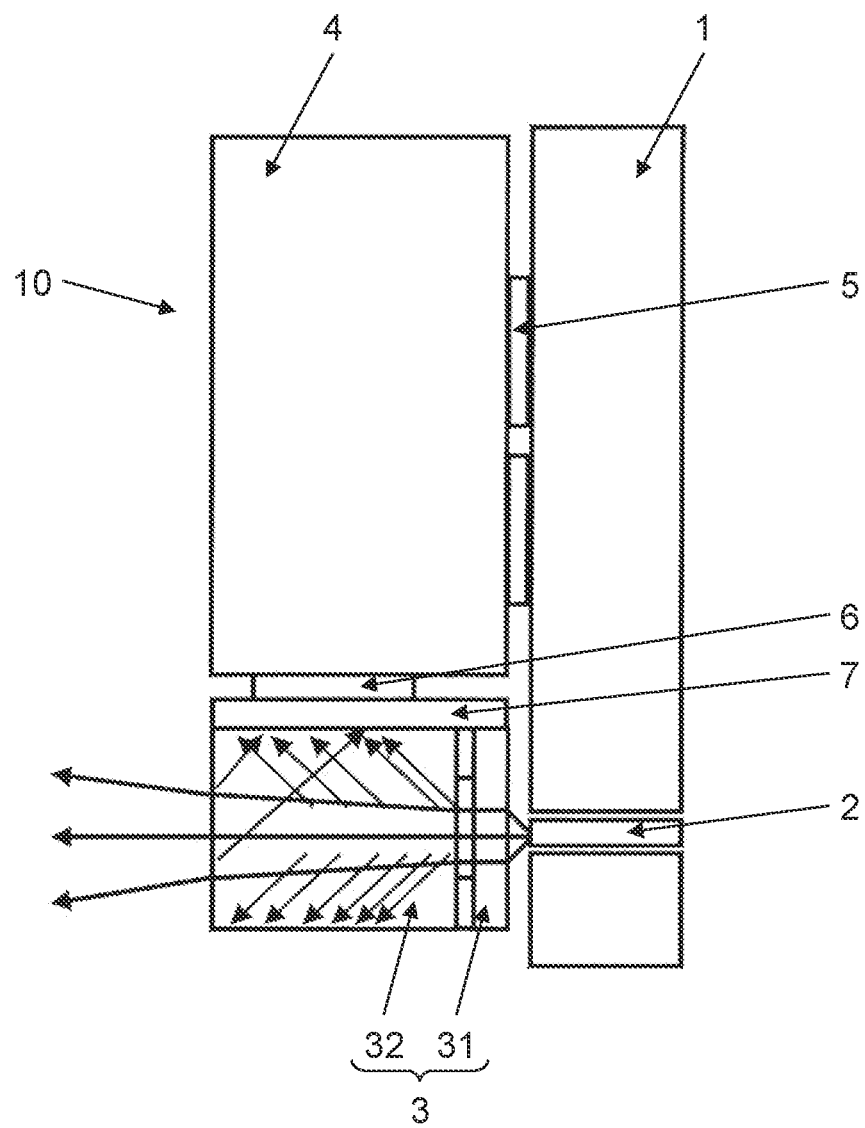
FIG. 1 is a cross-sectional view of an optical unit according to an exemplary embodiment of the present disclosure.

FIG. 1 illustrates a cross-sectional view of optical unit for a laser processing system 10 (hereinafter, also referred to as optical unit 10) according to an exemplary embodiment of the present disclosure. Optical unit 10 has laser diode 1, lens unit 3, and holding block 4. Laser diode 1 has a plurality of laser emitters 2 which emit laser light. Laser diode 1 may be an LD chip having the plurality of laser emitters 2. The number of laser emitters 2 is not particularly limited, and may be equal to or more than two. For example, laser diode 1 in which the plurality of laser emitters 2 equal to or more than two are arranged at a pitch of several hundred μm on one semiconductor chip may be used.

Lens unit 3 has a plurality of lenses. Lens unit 3 adjusts a spread angle of the light emitted from laser emitter 2. Lens unit 3 preferably includes fast axis collimation (FAC) lens 31 and beam twister (BT) lens 32. In laser diode 1 in which the plurality of laser emitters 2 are arranged, light emitted from each laser emitter 2 has a spread angle in a vertical direction and a horizontal direction. The vertical direction is a direction perpendicular to an emission surface of laser diode 1 and is a fast-axis direction (hereinafter, also referred to as a fast direction) of the emitted laser light. The horizontal direction is a direction parallel to the emission surface of laser diode 1 and is a slow-axis direction (hereinafter, also referred to as a slow direction) of the emitted laser light. First, light in the fast direction having a large spread angle is made into parallel light by FAC lens 31. After that, a collimation lens tilted at a predetermined angle with respect to the fast direction rotates the laser light emitted from laser emitter 2 by beam twister lenses 32 provided on a front surface and a back surface. Rotating light means rotating a cross-sectional shape of a plane perpendicular to a propagation direction of the light (beam).

FAC lens 31 and beam twister lens 32 are arranged at the same pitch as laser emitter 2. As a result, the laser light emitted from each laser emitter 2 passes through corresponding FAC lens 31 and beam twister lens 32, so that the spread angle is adjusted. The pitch of laser emitters 2 is not particularly limited, and a total energy of powers of the plurality of laser emitters 2 may be set to be maximized through FAC lens 31 and beam twister lens 32. From the viewpoint of a strength of lens unit 3 and processing accuracy of the laser processing system, the pitch of laser emitter 2 is preferably equal to or more than 100 um and equal to or less than 300 um.

Holding block 4 holds laser diode 1 and lens unit 3. Laser diode 1 and lens unit 3 need to align optical axes so as to maximize power while actually emitting the laser light, and relative positions need to be adjusted. Therefore, laser diode 1 and lens unit 3 cannot be directly bonded to each other. Therefore, as illustrated in FIG. 1, laser diode 1 and holding block 4 are bonded by first adhesive 5, and lens unit 3 and holding block 4 are bonded by second adhesive 6, so that it is possible to obtain optical unit 10 in which laser diode 1 and lens unit 3 are integrally held.

In a case where a photocurable resin is used as first adhesive 5 and second adhesive 6, it is necessary to transmit light for curing first adhesive 5 and second adhesive 6, so that holding block 4 has a light-transmitting property. Holding block 4 may have a light-transmitting property to such an extent that first adhesive 5 and second adhesive 6 can be cured, if necessary. That is, as long as the light can reach first adhesive 5 and second adhesive 6, only a part of holding block 4 may have a light-transmitting property. Quartz may be used as holding block 4. In this case, for example, the part of holding block 4 may be formed of quartz having a light-transmitting property, and the rest of holding block 4 may be formed of opaque quartz (also referred to as white quartz) having a low light-transmitting property. Opaque quartz is a quartz in which fine bubbles are dispersed.

As illustrated in FIG. 1, first adhesive 5 bonds laser diode 1 and holding block 4. It is preferable to use a photocurable resin as first adhesive 5 from the viewpoint of reducing distortion due to thermal expansion of laser diode 1 and lens unit 3 and improving adjustment accuracy. The photocurable resin is preferably an ultraviolet curable resin. From the viewpoint of improving the adjustment accuracy and reducing the positional deviation before and after curing, it is preferable to use a resin having low contractility during curing. As such a resin, for example, an epoxy resin using a cationic curing agent can be preferably used in particular. First adhesive 5 may be provided in a shape capable of bonding holding block 4 and laser diode 1 to each other. First adhesive 5 may be provided on an entire surface of holding block 4 facing laser diode 1, or may be partially provided.

As illustrated in FIG. 1, second adhesive 6 bonds lens unit 3 and holding block 4. As second adhesive 6, an adhesive in the same manner as that exemplified in first adhesive 5 described above can be used. Types of first adhesive 5 and second adhesive 6 may be the same or different from each other. Second adhesive 6 may be provided in a shape capable of bonding lens unit 3 and holding block 4 to each other. Second adhesive 6 may be provided on the entire surface of holding block 4 facing lens unit 3, or may be partially provided. Second adhesive 6 may be provided on an entire surface of lens unit 3 facing holding block 4, or may be partially provided.

Optical unit 10 has light-shielding film 7 having a light-reflecting property or a light-absorbing property. That is, optical unit 10 has at least one of a light-reflecting film and a light-absorbing film.

As illustrated in FIG. 1, light-shielding film 7 is located between lens unit 3 and holding block 4. By providing light-shielding film 7 having a light-reflecting property or a light-absorbing property between lens unit 3 and holding block 4, among laser beams reflected multiple times inside the lens unit, a laser beam which reaches the light-shielding film is reflected or absorbed by light-shielding film 7. Therefore, it becomes difficult for the laser light to enter holding block 4, and it is possible to prevent the laser light from reflecting inside holding block 4 and reaching first adhesive 5. Therefore, deterioration of first adhesive 5 can be suppressed.

Light-shielding film 7 may be provided so as to be in contact with holding block 4, may be provided so as to be in contact with lens unit 3, and may be provided so as to be in contact with both lens unit 3 and holding block 4. The adhesive which bonds lens unit 3 and holding block 4 may function as light-shielding film 7. Light-shielding film 7 preferably covers an entire surface to be bonded with holding block 4, of lens unit 3. In this case, it is possible to further suppress the laser light from entering holding block 4.

It is preferable that light-shielding film 7 is in contact with lens unit 3 and covers the entire surface of lens unit 3 facing holding block 4. In this case, second adhesive 6 bonds lens unit 3 and holding block 4 via light-shielding film 7. Therefore, when the laser light reflected multiple times inside lens unit 3 reaches light-shielding film 7, the laser light is reflected or absorbed by light-shielding film 7. Therefore, it becomes difficult for the laser light to reach second adhesive 6. Therefore, in this case, deterioration of second adhesive 6 can be suppressed.

In the present exemplary embodiment, light-shielding film 7 has a light-reflecting property. That is, in the present exemplary embodiment, light-shielding film 7 is a light-reflecting film, and the laser light which reaches light-shielding film 7 is reflected by light-shielding film 7. A type of the light-reflecting film is not particularly limited as long as the light-reflecting film can reflect light and does not easily hinder adhesiveness between lens unit 3 and holding block 4.

In the present exemplary embodiment, the light-reflecting film contains aluminum. An aluminum film may be used as the light-reflecting film. A thickness of the aluminum film is not particularly limited, but is preferably equal to or more than 50 nm, for example. In this case, the aluminum film has a sufficient light-reflecting property to reflect the laser light. A method for forming the aluminum film is not particularly limited, but the aluminum film can be formed by, for example, sputtering or vapor deposition.

Exemplary Embodiment 2

In the present exemplary embodiment, a case where light-shielding film 7 has a light-absorbing property will be described. That is, in the present exemplary embodiment, light-shielding film 7 is a light-absorbing film, and the laser light which reaches light-shielding film 7 is absorbed by light-shielding film 7. A type of the light-absorbing film is not particularly limited as long as the light-absorbing film can absorb light and does not easily hinder the adhesiveness between lens unit 3 and holding block 4. In a case where the light-absorbing film is used as light-shielding film 7, heat energy is generated by absorbing light, but since a heat capacity of lens unit 3 is large, an influence of the generated heat energy is small.

In the present exemplary embodiment, the light-absorbing film contains chromium oxide. A chromium oxide film may be used as the light-absorbing film. A thickness of the chromium oxide film is not particularly limited, but is preferably equal to or more than 50 nm, for example. In this case, the chromium oxide film has a sufficient light-absorbing property to absorb the laser light. A method for forming the chromium oxide film is not particularly limited, but the chromium oxide film can be formed by, for example, sputtering or vapor deposition.

Since the components other than light-shielding film 7 are the same as those in EXEMPLARY EMBODIMENT 1, description thereof will be omitted.

Exemplary Embodiment 3

Figure 2:
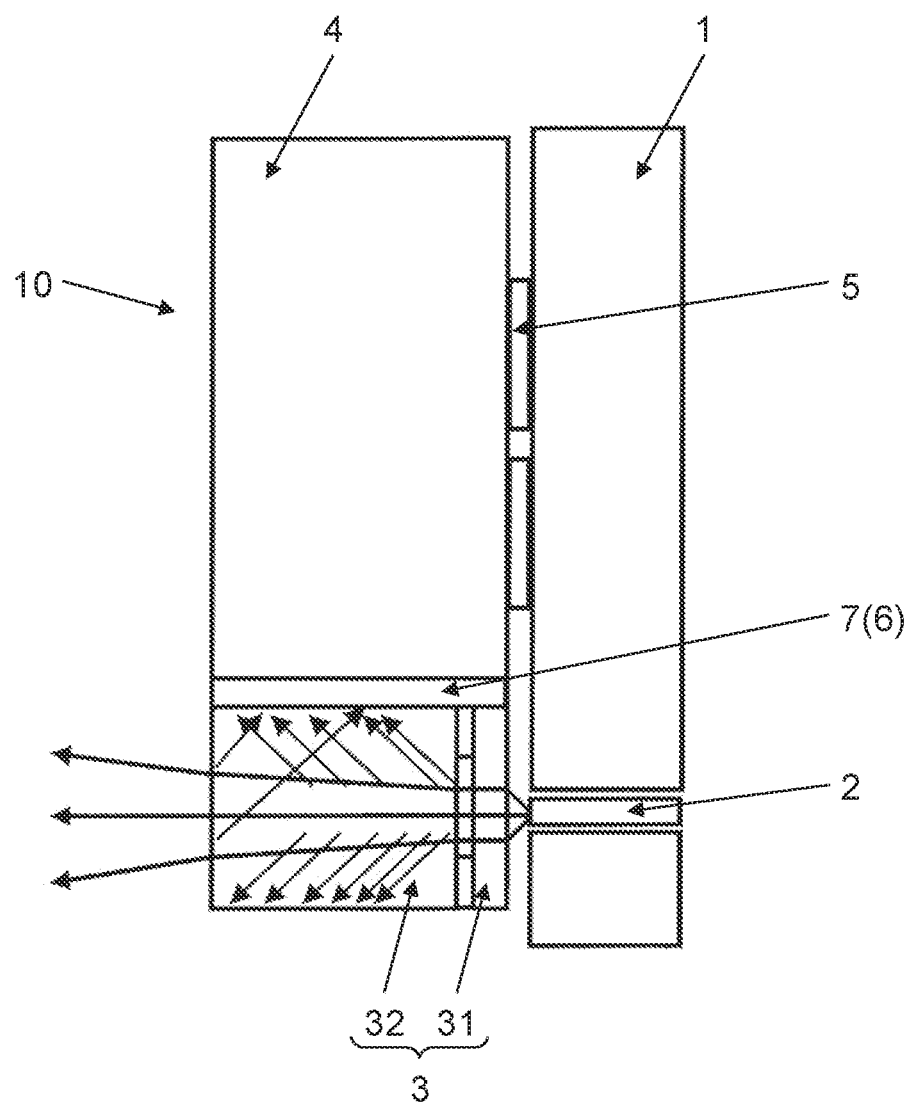
FIG. 2 is a cross-sectional view of an optical unit according to another exemplary embodiment of the present disclosure.

In the present exemplary embodiment, a case where light-shielding film 7 also serves as second adhesive 6 will be described with reference to FIG. 2. In this case, second adhesive 6, that is, light-shielding film 7, may be provided on the entire surface of lens unit 3 facing holding block 4, or may be partially provided. Meanwhile, from the viewpoint of preventing laser light from reaching holding block 4, second adhesive 6 is preferably provided on the entire surface facing lens unit 3 and holding block 4.

Second adhesive 6 is preferably any one of a white adhesive and a black adhesive. In a case where second adhesive 6 is the white adhesive, second adhesive 6 functions as light-shielding film 7 having a light-reflecting property. The white adhesive may be one in which white powder such as titanium oxide and calcium sulfide is dispersed in an adhesive. When the white adhesive is used, there is a case where curing reaction by light such as ultraviolet rays may be insufficient, so it is preferable to use a thermosetting resin as the adhesive.

In a case where second adhesive 6 is the black adhesive, second adhesive 6 functions as light-shielding film 7 having a light-absorbing property. The black adhesive may be one in which black powder such as carbon black is dispersed in an adhesive. Further, since the black adhesive has insufficient curing reaction by ultraviolet rays, it is desirable that the black adhesive is an adhesive using a thermosetting resin.

Since the components other than light-shielding film 7 are the same as those in EXEMPLARY EMBODIMENT 1, description thereof will be omitted.

Laser Processing System

A laser processing system using optical unit 10 according to the present disclosure will be described in detail.

The laser processing system includes optical unit 10 and a condensing section which condenses laser light emitted from laser emitter 2 inside optical unit 10.

A laser processing apparatus may include a combination section which combines laser beams having different wavelengths into one beam, in addition to optical unit 10 and the condensing section. In the present exemplary embodiment, a mode in which the laser processing apparatus has the combination section will be described.

In the laser processing apparatus according to the present exemplary embodiment, a plurality of laser beams emitted from the plurality of laser emitters 2 are superimposed by the combination section such as a diffraction grating and condensed as one laser beam.

A propagation direction of each laser light emitted from the plurality of laser emitters 2 is changed by the combination section. A spread angle of the laser light emitted from each of laser emitters 2 is adjusted by the lens in lens unit 3. Preferably, the spread angle of the laser light is adjusted by FAC lens 31 and beam twister lens 32 in lens unit 3. After that, the laser light is preferably parallelized by a collimator such as a convex lens. The parallelized laser light is condensed in a specific direction by the combination section such as a diffraction grating. The diffraction grating may be reflective or transmissive.

The combination section is not limited to the diffraction grating, and a combination section using a difference in wavelength, a combination section using polarization characteristics, and a space combination section may be used. In the combination section using the difference in wavelength, for example, a dichroic mirror and a prism can be used to couple laser beams having different wavelengths. In the combination section using the polarization characteristics of laser light, for example, an angle formed by a polarization direction of one laser beam and another polarization direction of another laser beam is 90 degrees, and the laser beams can be coupled by using a polarization beam splitter. The space combination section can spatially couple the laser beams by using, for example, a condenser lens or a mirror.

The laser beam combined by the combination section is condensed on a workpiece by a condensing section such as a mirror. For example, laser light superimposed and condensed by the combination section is reflected by a mirror except for a part of the mirror and returned to the laser emitter side. As a result, the laser light externally resonates, and a part of the laser light of which output is increased by the external resonance passes through the mirror and is emitted to the outside. By introducing the emitted laser light into an optical fiber and processing the light from the optical fiber with the optical system, the laser light can be converged on the workpiece for processing.

The optical unit for a laser processing system and the laser processing system according to the present disclosure are useful for applications such as welding, cutting, drilling, and material processes.

What is claimed is:

1. An optical unit for a laser processing system, the optical unit comprising:
   a laser diode that includes a plurality of laser emitters which emit laser light;
   a lens unit that includes a plurality of lenses;
   a holding block having a light-transmitting property; and
   a light-shielding film formed on a surface of the lens unit facing the holding block,
   wherein the holding block and the laser diode are bonded to each other with a first adhesive, and
   wherein the light-shielding film and the holding block are bonded to each other with a second adhesive.

2. The optical unit for a laser processing system of claim 1,
   wherein the light-shielding film contains aluminum.

3. The optical unit for a laser processing system of claim 1,
   wherein the second adhesive is a white adhesive.

4. The optical unit for a laser processing system of claim 1,
   wherein the light-shielding film has a light-reflecting property.

5. The optical unit for a laser processing system of claim 1,
   wherein the light-shielding film contains chromium oxide.

6. The optical unit for a laser processing system of claim 1,
   wherein the second adhesive is a black adhesive.

7. The optical unit for a laser processing system of claim 1,
   wherein the light-shielding film has a light-absorbing property.

8. A laser processing system comprising:
   the optical unit according to claim 1; and
   a condensing section that condenses the laser light.

* * * * *